(12) United States Patent
Maric et al.

(10) Patent No.: US 12,386,185 B2
(45) Date of Patent: Aug. 12, 2025

(54) BATTERY ASSEMBLY FOR HEAD-MOUNTED DISPLAY

(71) Applicant: Apple Inc., Cupertino, CA (US)

(72) Inventors: Ivan S. Maric, Campbell, CA (US); Aidan N. Zimmerman, Poway, CA (US); Ritu Shah, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 244 days.

(21) Appl. No.: 18/451,050

(22) Filed: Aug. 16, 2023

(65) Prior Publication Data

US 2025/0060601 A1 Feb. 20, 2025

(51) Int. Cl.
*G02B 27/01* (2006.01)
*H05K 5/00* (2025.01)

(52) U.S. Cl.
CPC ..... *G02B 27/0176* (2013.01); *G02B 27/0172* (2013.01); *H05K 5/0086* (2013.01); *G02B 2027/0163* (2013.01); *G02B 2027/0178* (2013.01)

(58) Field of Classification Search
None
See application file for complete search history.

(56) References Cited

U.S. PATENT DOCUMENTS

| | | | |
|---|---|---|---|
| 7,310,072 B2 * | 12/2007 | Ronzani | G02B 27/0176 345/7 |
| 10,768,500 B2 * | 9/2020 | Osterhout | G02B 27/0172 |
| 2012/0075169 A1 * | 3/2012 | Iba | G02B 27/0149 345/8 |
| 2015/0153825 A1 * | 6/2015 | Lee | G06F 1/1694 345/8 |
| 2019/0286224 A1 * | 9/2019 | De Nardi | G06F 3/011 |
| 2021/0325678 A1 * | 10/2021 | Maric | H04N 13/344 |

\* cited by examiner

*Primary Examiner* — Dorothy Harris
(74) *Attorney, Agent, or Firm* — Dorsey & Whitney LLP

(57) ABSTRACT

A head-mountable device can include an optical module to present visual information to a user, a structure movably attached to the optical module, the structure defining a motion path of the optical module. The structure can include a housing defining an internal volume, and a battery disposed within the internal volume.

20 Claims, 9 Drawing Sheets

BATTERY ASSEMBLY FOR HEAD-MOUNTED DISPLAY

FIELD

The described embodiments relate generally to a battery assembly for head-mounted displays. More particularly, the present embodiments relate to a battery integrated guide rail for an optical module of a head-mountable device.

BACKGROUND

A primary challenge when developing head-mounted displays (HMDs), particularly HMDs that have small form factors, is achieving a suitable battery life while still maintaining functionality and an acceptable shape and size. Performing the necessary computing functions, while still making the HMD stylish and light enough that a user could wear the device for an extended period of time demands novel solutions.

Given the power needs of HMDs and current battery technology, a user may be required to remove and charge the device several times a day or keep the device tethered to a power source. Additionally, internal batteries with lower power capacities can be utilized to maintain power to fundamental operations of the system, such as memory retention. Accordingly, there is a need to enhance the options for power sources in an HMD.

SUMMARY

According to some aspects of the present disclosure, a head-mountable device can include an optical module to present visual information to a user, a structure movably attached to the optical module, the structure defining a motion path of the optical module. The structure can include a housing defining an internal volume, and a battery disposed within the internal volume.

In some examples, the structure can be a first guide rail, the battery can be a first battery, the optical module can be a first optical module, and the head-mountable device can further include a second optical module movably attached to a second guide rail, the second guide rail housing a second battery. The structure can include an upper structure, the optical module being movably attached to the upper structural component, and a lower structure, the lower structural component housing a second battery.

In some examples, the structure can include a guide rail that defines a motion pathway of the optical module. The structure can be cylindrical. The structure can include an electrical connection establishing electrical communication between the battery and the head-mountable device. The housing can define an air gap between an internal surface of the housing and the battery.

In some examples, the structure can be attached to a mounting enclosure of the head-mountable device, an electrical pathway positioned through the mounting enclosure. The head-mountable device can include a cable extending from the battery through an open end of the structure. The battery can include an anode material and a cathode material. Each of the anode material and the cathode material can directly contact the housing of the structure.

According to some aspects, a guide rail for a head-mounted display can include a housing defining a exterior surface and an internal volume, and a power source positioned in the internal volume. The exterior surface of the guide rail can interface with a movable lens structure.

In some examples, the power source can be removable from the housing. The power source can be fixed in the housing via an adhesive. The guide rail can include a sled fixed to the battery and removably attached to the housing. The sled can include a protrusion to releasably couple with a recess of the housing. The housing can include a carbon fiber filled composite. The housing can define a vent forming an airflow path between the internal volume and an ambient environment.

According to some aspects, a head-mountable device can include a battery including a battery housing, and an optical module including an actuator rotatably engaging the battery housing to translate the optical module. In some examples, the battery can include a cylindrical cell. The battery housing can include a flame resistant material.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
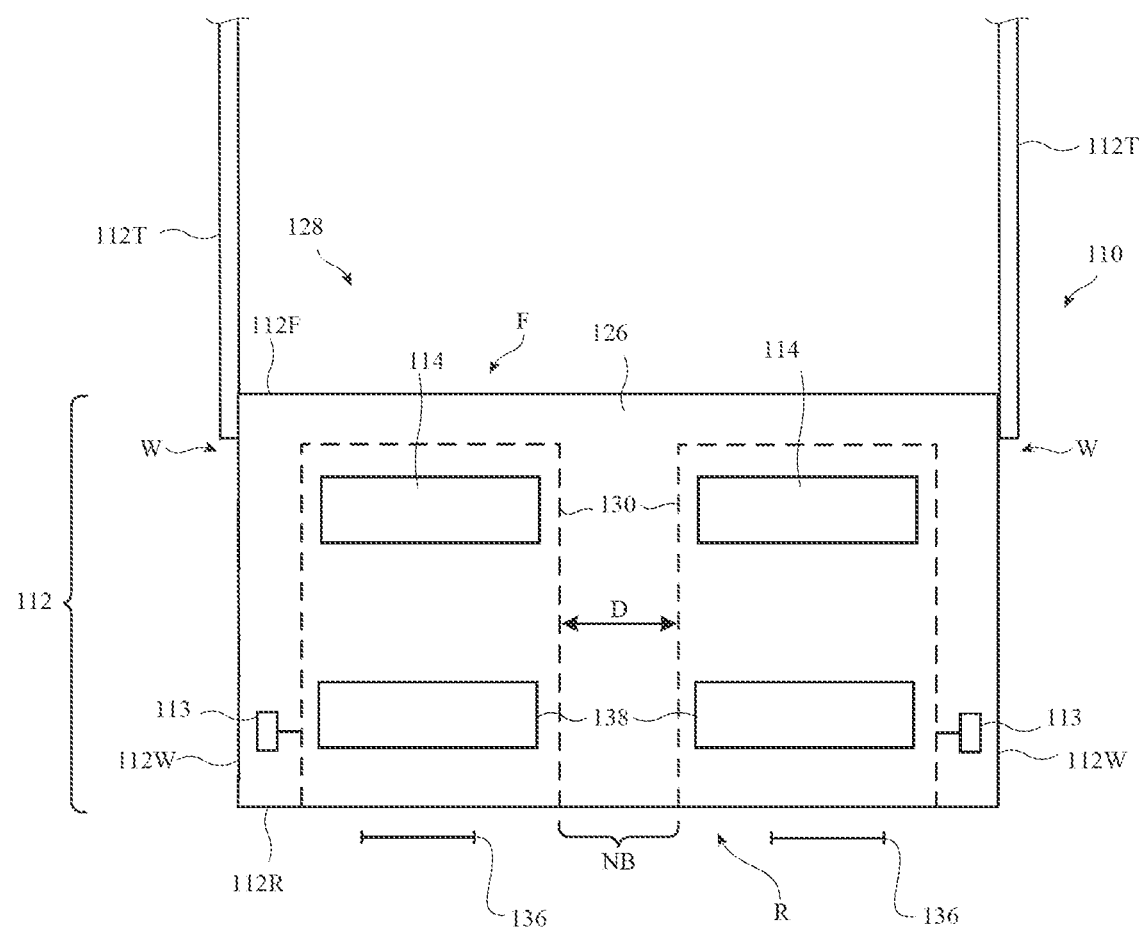
FIG. 1 shows a top view of a head-mountable device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Given the power needs of HMDs, a user may be faced with the decision of either removing and charging the device several times a day or keeping the device tethered to a power source. Accordingly, there is a need to enhance the available options for power sources in an HMD. The present disclosure provides solutions that enable a battery to be integrated into a structural component or structure, such as a guide rail for an optical module, without increasing the overall size or shape of the HMD.

HMDs can utilize on board batteries to handle peak loads or to provide greater portability. Further, HMDs need to be lightweight and space efficient to enhance the user experience. HMDs are formed with a number of structural components, including guide rods (also referred to herein as guide rails or structural components) to allow optical modules to translate for adjustment to accommodate the user's interpupillary distance (IPD). In some examples, the guide rods can be hollow to reduce weight.

The present disclosure describes using guide rods as the thermal and mechanical enclosure for a cylindrical cell battery. In some examples, the battery integrated into a guide rod can be a pouch cell, prismatic cell, or any other suitable lithium battery. The battery housing becomes a linear mechanism surface that can be tuned for a low coefficient of friction to facilitate the continued function as a guide rail. Similarly, the properties of composite materials selected for the guide rail housing can provide thermal resistance and mechanical strength. Further, complexity of traditional mechanical housings for batteries are eliminated, thereby reducing costs and weight, and enabling more efficient packaging solutions in system.

While some HMDs can also include a larger primary battery that is integrated into the HMD housing or a separate external battery that is tethered to the HMD, the inclusion of batteries into the guide rails can be advantageous for any number of low-power functionalities or peak power loads. For example, the batteries integrated into the guide rails can be used when the HMD is unplugged from a primary power source, can be used during a reboot process, can be used for memory retention, and/or can be used for low battery modes.

The guide rail can include an interconnect extending out from the battery and connected to a main logic board (MLB). In some examples, the HMD can include at least one guide rail, and in some examples can include four guide rails (two upper and two lower). Each guide rail can be integrated with a battery positioned within the hollow volume of the guide rail housing. In some examples, the guide rail can be a structural component with an optical module movably attached thereto.

These and other embodiments are discussed below with reference to FIGS. 1-13. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

A top view of an illustrative electronic device 110 is shown in FIG. 1. Electronic device 110 of FIG. 1 can include an HMD, which can include smart glasses or alternative reality or virtual reality goggles. As shown in FIG. 1, device 110 can include a housing 112. The housing 112 can include a housing wall, external housing, housing structures, enclosure, or case that can be formed from materials such as polymer, glass, metal, crystalline materials such as sapphire, ceramic, fabric, foam, wood, other materials, and/or combinations of these materials.

The electronic device 110 can be any suitable shape. The housing 112 can form a head-mounted housing in the shape of a pair of goggles (e.g., goggles having optional head straps such as straps 112T, a nose bridge portion in nose bridge region NB that is configured to fit over a user's nose and help support housing 112 on the user's nose, etc.) and/or other head-mounted structures. The housing 112 can define an interior region 126 and an exterior region 128. The housing 112 can include portions such as front portion (front wall) 112F on front face F of the device 110, a rear portion (rear wall) 112R on an opposing rear face R of the device 110, and sidewall portions 112W on the sides W that extend between the front portion 112F and the rear portion 112R, such that the housing 112 encloses the interior region 126.

Electrical and optical components can be mounted within housing 112 (e.g., in the interior region 126). As an example, the housing 112 can include optical components disposed within the interior region 126, such as displays 114 and lenses 138. The displays 114 and the lenses 138 can be mounted in optical modules 130 (sometimes referred to as lens barrels, display and lens support structures, etc.). Images, visual information, or any visual data from the displays 114 can be viewed (i.e., visible to the user) from eye boxes 136 through the lenses 138. A left display and left lens in a left optical module 130 can be used to present a left-eye image to a user's left eye in a left eye box 136, and a right display and right lens in a right optical module 130 may be used to present a right-eye image to a user's right eye in right eye box 136. Manual adjustment mechanisms and/or electrically adjustable actuators 113 (e.g., motors or other electrically adjustable positioners) may be used to move optical modules 130 horizontally across the front of the user's face (e.g., to adjust distance D between modules 130 along a direction parallel to the X-axis or nearly parallel to the X-axis of FIG. 1). The optical modules 130 can include actuators that rotatably engage a guide rail or battery housing to move the optical module along a path defined by the guide rail/battery. Optical modules 130 may, for example, be moved closer to each other or farther apart from each other as needed to accommodate different user interpupillary distances (IPD).

Any of the features, components, and/or parts, including the arrangements and configurations thereof shown in FIG. 1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 1.

Figure 2:
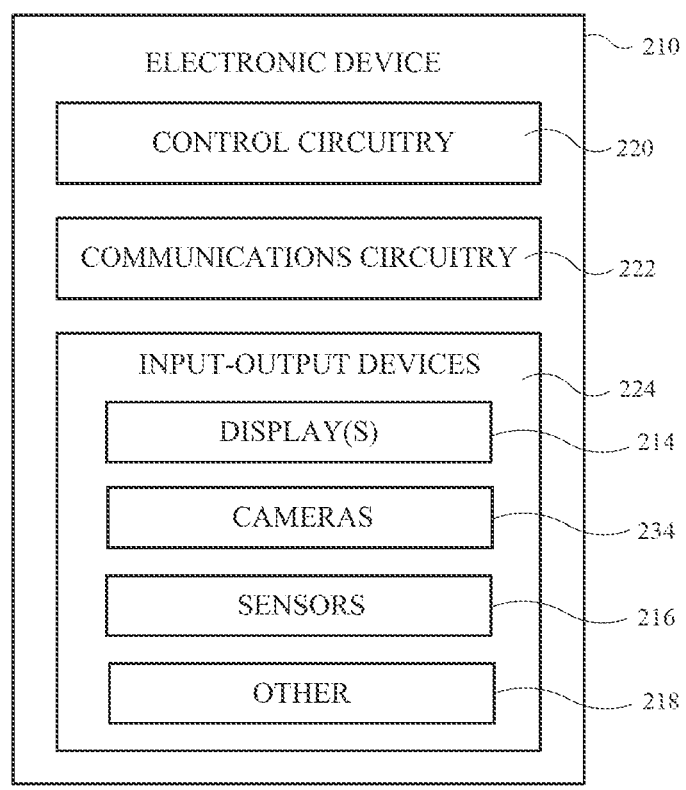
FIG. 2 shows a schematic block diagram.

A schematic diagram of an illustrative electronic device is shown in FIG. 2. Device 210 of FIG. 2 may be operated as a stand-alone device and/or the resources of device 210 may be used to communicate with external electronic equipment. As an example, communications circuitry in device 210 may be used to transmit user input information, sensor information, and/or other information to external electronic devices (e.g., wirelessly or via wired connections) and/or may be used to receive such information from external electronic devices. Each of these external devices may include components of the type shown by device 210 of FIG. 2.

As shown in FIG. 2, the electronic device 210 can include control circuitry 220. Control circuitry 220 may include storage and processing circuitry for supporting the operation of the device 210. The storage and processing circuitry can include storage such as nonvolatile memory (e.g., flash memory or other electrically-programmable-read-only memory configured to form a solid-state drive), volatile memory (e.g., static or dynamic random-access-memory), etc. Processing circuitry in control circuitry 220 can be used to gather input from sensors (e.g., cameras) and other input devices and may be used to control output devices. The processing circuitry can be based on one or more microprocessors, microcontrollers, digital signal processors, baseband processors and other wireless communications circuits, power management units, audio chips, application specific integrated circuits, etc. During operation, control circuitry 220 can use display(s) 214 and other output devices in providing a user with visual output and other output.

To support communications between the device 210 and external equipment, the control circuitry 220 can communicate using communications circuitry 222. The communications circuitry 222 can include antennas, radio-frequency transceiver circuitry, and other wireless communications circuitry and/or wired communications circuitry. The circuitry 222, which can sometimes be referred to as control circuitry and/or control and communications circuitry, can support bidirectional wireless communications between the device 210 and external equipment (e.g., a companion device such as a computer, cellular telephone, or other electronic device, an accessory such as a point device, computer stylus, or other input device, speakers, or other output devices, etc.) over a wireless link. For example, the circuitry 222 can include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a Wi-Fi® link, a wireless link operating at a frequency between 10 GHz and 400 GHz, a 60 GHz link, or other millimeter wave link, a cellular telephone link, or other wireless communications link. The device 210 can include power circuits for transmitting and/or receiving wired and/or wireless power and may include batteries or other energy storage devices. For example, the device 210 can include a coil and a rectifier to receive wireless power that is provided to circuitry in device 210.

The device 210 can include input-output devices 224. Electronic components such as input-output devices 224 can be used in gathering user input, in gathering information on the environment surrounding the user, and/or in providing a user with output.

The input-output devices 224 can include one or more displays such as display(s) 214. The display(s) 214 can include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as micro LEDs), and/or other display devices.

The input-output devices 224 can include cameras 234. The cameras 234 can include visible light cameras, infrared cameras, and/or cameras that are sensitive at multiple wavelengths, may include three-dimensional camera systems such as depth sensors (e.g., structured light sensors and/or depth sensors based on stereo imaging devices that capture three-dimensional images), may include time-of-flight cameras, and/or may include other cameras. The cameras 234 can face toward the user of device 210 and/or away from the user of device 210.

The sensors 216 in input-output devices 224 can include force sensors (e.g., strain gauges, capacitive force sensors, resistive force sensors, etc.), audio sensors such as microphones, touch and/or proximity sensors including capacitive sensors such as a touch sensor that forms a button, trackpad, or other input device), and other sensors. If desired, sensors 216 may include optical sensors such as optical sensors that emit and detect light, ultrasonic sensors, optical touch sensors, optical proximity sensors, and/or other touch sensors and/or proximity sensors, monochromatic and color ambient light sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, optical sensors such as self-mixing sensors and light detection and ranging (LIDAR) sensors, humidity sensors, moisture sensors, gaze tracking sensors, electromyography sensors to sense muscle activation, facial sensors, interferometric sensors, time-of-flight sensors, magnetic sensors, resistive sensors, distance sensors, angle sensors, and/or other sensors. In some arrangements, device 210 may use sensors 216 and/or other input-output devices 224 to gather user input. For example, input-output devices 224 such as buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

Input-output devices 224 may include optical components such as depth sensors (e.g., structured light sensors or other sensors that gather three-dimensional image data), optical proximity sensors, ambient light sensors (e.g., color ambient light sensors), optical time-of-flight sensors and other sensors 216 that are sensitive to visible and/or infrared light and that may emit visible and/or infrared light (e.g., devices 224 may contain optical sensors that emit and/or detect light). For example, a visible-light image sensor in a camera may have a visible light flash or an associated infrared flood illuminator to provide illumination while the image sensor captures a two-dimensional and/or three-dimensional image. An infrared camera such as an infrared structured light camera that captures three-dimensional infrared images may have an infrared flood illuminator that emits infrared flood illumination and/or may have a dot projector the emits an array of infrared light beams. Infrared proximity sensors may emit infrared light and detect the infrared light after the infrared light has reflected from a target object.

If desired, electronic device 210 may include additional components (see, e.g., other devices 218 in input-output devices 224). The additional components may include haptic output devices, actuators for moving movable structures in device 210, audio output devices such as speakers, light-emitting diodes for status indicators, light sources such as light-emitting diodes that illuminate portions of a housing and/or display structure, other optical output devices, and/or other circuitry for gathering input and/or providing output. Device 210 may also include a battery or other energy storage device, connector ports for supporting wired communication with ancillary equipment and for receiving wired power, and other circuitry.

To help maintain desired alignment between optical modules 230 as the optical modules 230 are moved by actuators, optical modules 230 may be mounted on optical module guiding structures such as guide rails or other elongated support members. This type of arrangement is shown in the top view of FIG. 3.

Any of the features, components, and/or parts, including the arrangements and configurations thereof shown in FIG. 2 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 2.

Figure 3:
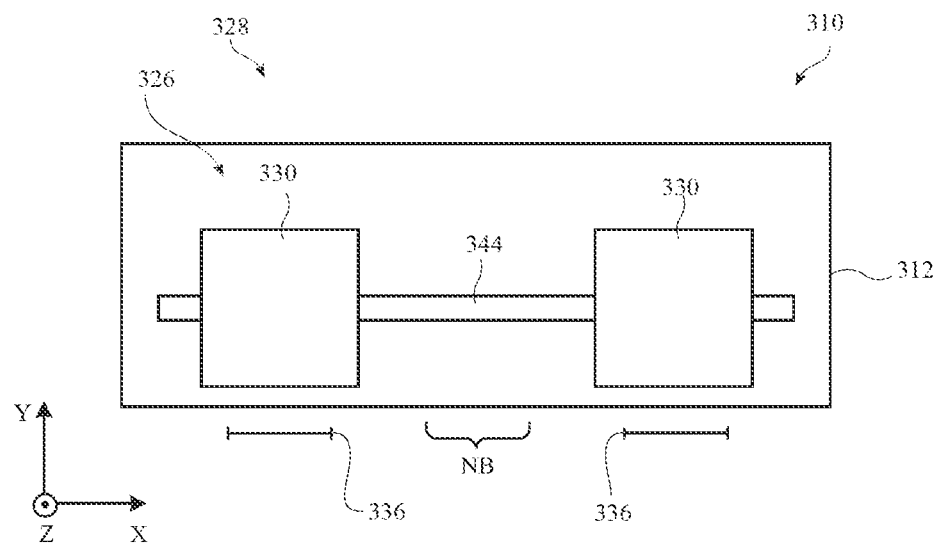
FIG. 3 shows a top view of a head-mountable device.

FIG. 3 illustrates a top view of an HMD or electronic device 310 including optical modules 330 movable along a guide rail 344. The electronic device 310 can be substantially similar to, including some or all of the features of, the electronic devices described herein. As shown in FIG. 3, the optical modules 330 can be movably or slidably coupled to guide rail 344 to allow the optical modules 330 to move horizontally (e.g., laterally along the X-axis to accommodate different user interpupillary distances).

The guide rails 344 can include a circular cross-sectional shape (e.g., guide rail 344 may be cylindrical rods) or may have other cross-sectional shapes. Guide rod 344 may be formed from metal, polymer, composites, and/or other materials. Hollow and/or solid members may be used in forming guide rail 344. To help reduce friction between guide rail 344 and the optical modules 330, the guide rail 344 and/or mating portions of optical modules 330 can include a low-friction coating (e.g., nickel, etc.).

In some examples, the guide rail 344 can span the width of housing 312. For example, the electronic device 310 can include left and right guide rails 344 in the device 310 that are joined at a housing support structure and are aligned with nose bridge portion NB. Additionally, in some examples, left and right guide rails 344 may be formed as integral portions of a single guide rail that extends across the housing 312. The guide rail 344 can be straight or can have a bend or curve at the nose bridge portion NB (e.g., to rake the left and right sides of the guide rails backwards slightly to conform to the shape of a user's face). As shown in the rear view of device 410 of FIG. 4, there may be upper and lower guide rails 444T and 444B (collectively referred to as guide rails 444). In some examples, the device 410 can include four guide rails (two upper and two lower). Arrangements with fewer guide rails or more guide rails can also be used, in some examples.

Figure 4:
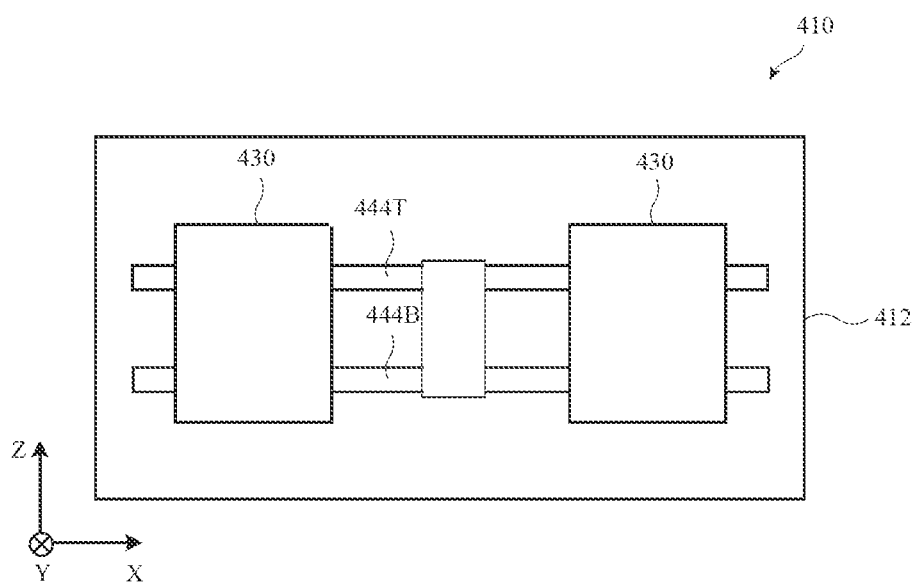
FIG. 4 shows a rear view of a head-mountable device.

Any of the features, components, and/or parts, including the arrangements and configurations thereof shown in FIGS. 3 and 4 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 3 and 4.

Figure 5:
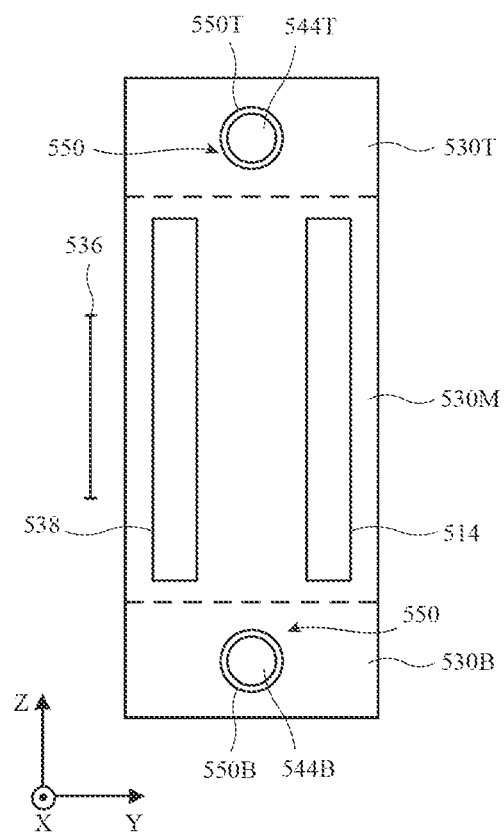
FIG. 5 shows a side cross-sectional view a head-mountable device

FIG. 5 is a side view of an illustrative optical module mounted on guide rails 544. In the example of FIG. 5, optical module 530 has an upper portion such as portion 530T and a lower portion such as portion 530B. Portions 530T and/or 530B may be integrally formed with main supporting structure 530M of the lens barrel structures and/or other support structures of optical module 530, and/or may be separate members that are coupled (e.g., using welds, fasteners, adhesive, etc.) to main supporting structure 530M. Lens 538 may be aligned with display 514 so that an image on display 514 can be viewed through lens 538 from eye box 536.

As shown in FIG. 5, optical module 530 may have portions that receive and couple to guide rails 544 while allowing optical module 530 to slide along guide rails 544. For example, upper portion 530T may have a guide rail opening (optical module opening) 550 such as opening 550T that receives upper guide rail 544T and lower portion 530B may have a guide rail opening such as opening 550B that receives lower guide rail 544B. Openings 550T and 550B may by cylindrical openings with circular cross-sectional shapes that receive the cylindrical members forming rails 544T and 544B and/or may have other shapes that partly or fully surround rails 544T and 544B.

To prevent rails 544 from becoming stuck in guide rail openings 550 of optical module 530, the inner diameter of optical module openings may be slightly larger (e.g., by 2-50 microns, at least 5 microns, less than 100 microns, or other suitable amount) than the outer diameter of rails 544. To prevent excess motion, which could lead to misalignment of optical modules, device 510 may be provided with guide rail biasing systems. The guide rail biasing systems may have movable biasing members (e.g., pins, plates, spherical members, hemispherical members, etc.) and biasing elements that apply force to the biasing members. The biasing elements may be, for example, springs such as coil springs, leaf springs, and/or other spring members, may be compressed polymer (e.g., elastomeric material, foam, etc.), may be magnets, and/or may be other biasing components that can be used to bias the biasing members in a desired direction.

Using the guide rail biasing systems, guide rails 544 may be pushed towards desired positions within openings 550 to help remove undesired play between guide rails 544 and openings 550. As an example, guide rails 544 may be pressed against the inner surfaces of openings 550 (e.g., at a location on the side of openings 550 that faces eye boxes 536 rather than the opposing side of openings 550 that faces outwardly away from the user) and/or may be pressed against a structure mounted within openings 550 such as a pin or other support member.

Any of the features, components, and/or parts, including the arrangements and configurations thereof shown in FIG. 5 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 5.

Figure 6A:
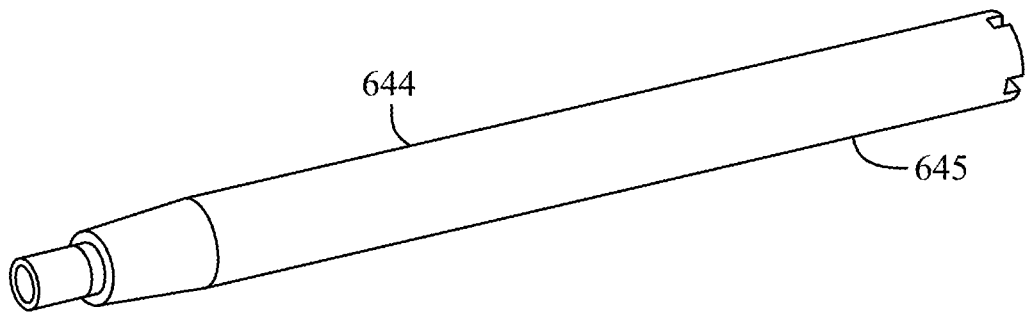
FIG. 6A shows a perspective view of a guide rail.

FIG. 6A shows a perspective view of a guide rail 644. The guide rail 644 can be substantially similar to, including some or all of the features of, the guide rails described herein. The guide rail 644 can include an exterior shell, casing, or housing 645. The housing 645 can define an elongated cylindrical shape. The length of the housing 645 can be several times greater than the width or diameter. In some examples, a cross-section of the housing 645 can be circular, however other shapes are possible including rectangular, oval, etc.

The housing 645 of the guide rail 644 can include or can be made from a variety of materials. In some examples, the housing 645 can include a material having a low coefficient of friction such that the housing 645 includes a smooth exterior surface. The housing 645 can be a composite of materials, in some examples. In other examples, the housing 645 can be a clad of materials. The housing 645 can include one or more of carbon fiber, a carbon fiber filled composite, epoxy-based carbon fiber prepreg, stainless steel, titanium, aluminum, or plastic. The resin may be thermoset, such as an epoxy, or thermoplastic, such as PEEK. The housing material can be selected or tuned to have high thermal resistance and mechanical strength properties. The housing 645 can, in some examples, include a flame-resistant material. In some examples, the guide rail 644 can include an inner layer of flame-resistant material adjacent the housing 645. In some other examples, the guide rail 644 can include a flame-retardant epoxy resin or plastic overlaying structural carbon layers of the housing 645.

In some examples, the housing 645 of the guide rail 644 can be hollow (i.e., the housing 644 defining an interior volume). The hollow nature of the guide rail 644 can reduce the overall weight of the system and can also utilize improved stiffness of a hollow structure.

Figure 6B:
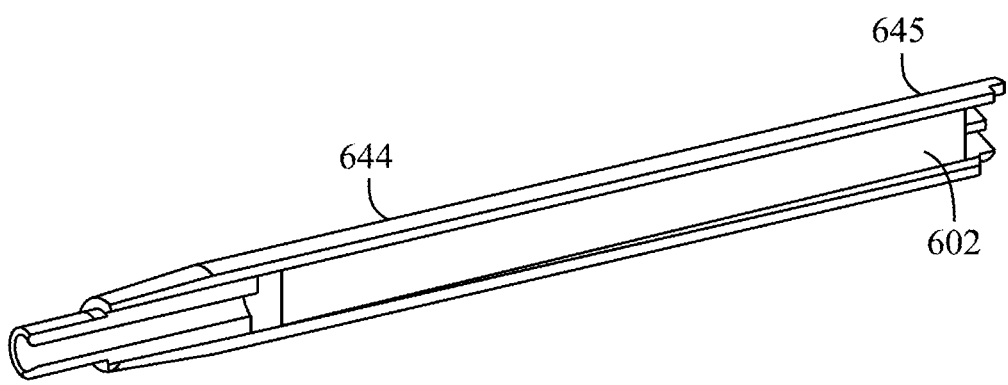
FIG. 6B shows a cross-sectional perspective view of a guide rail.

FIG. 6B shows a cross-sectional perspective view of the guide rail 644. As shown, a power source, such as a battery 602, can be housed, positioned, surrounded, encapsulated, or disposed within the internal volume defined by the housing 645 of the guide rail 644. Thus, the guide rail 644 can be integrated with a battery, or in other words, the guide rail 644 can be a battery integrated guide rail. Further details regarding battery integrated guide rails are described below.

Any of the features, components, and/or parts, including the arrangements and configurations thereof shown in FIGS. 6A and 6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 6A and 6B.

Figure 7:
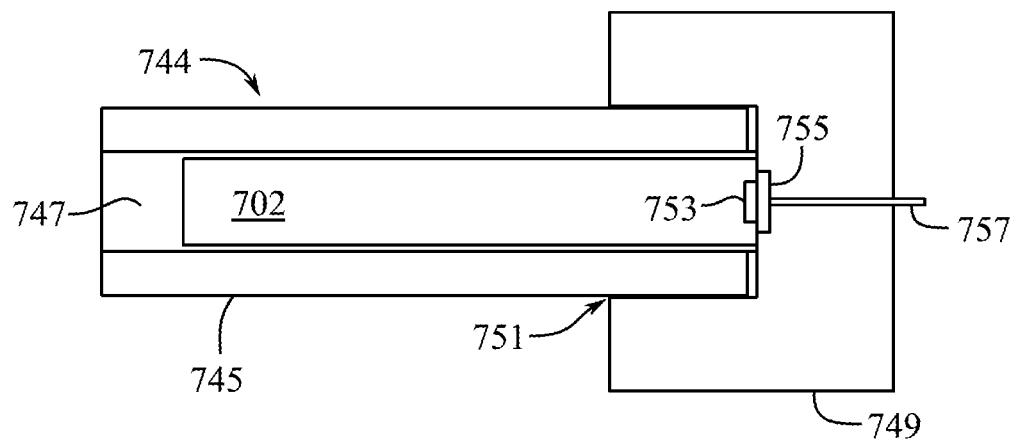
FIG. 7 shows a cross-sectional view of a battery integrated guide rail.

FIG. 7 shows a cross-sectional view of a guide rail 744. The guide rail 744 can be substantially similar to, including some or all of the features of, the guide rails described herein. In some examples, the HMD can include a mounting component 749. The mounting component 749 can be part of the enclosure of the HMD. In some examples, the guide rail 744 can be received into a recess 751 of the mounting component 749. The guide rail 744 can be removably or fixedly mounted or attached to the mounting component 749.

In some examples, the guide rail 744 can include an exterior shell or housing 745. A battery 702 can be fixed within the guide rail 744. In some examples, the battery 702 can be adhered to the interior of the guide rail 744 using adhesive 747. The adhesive 747 can partially or entirely fill the space between the battery 702 and the housing 745. In some examples, the adhesive 747 can provide shear coupling between opposing sides of the housing 745 of the guide rail 744. Thus, the battery 702 can be permanently or fixedly secured within the housing 745 of the guide rails 744.

In some examples, the battery 702 can include an electrical contact, terminal, connection, or outlet 753. The electrical contact 753 can create an electrical pathway to transfer power from the battery 702 to the HMD. In some examples, the enclosure 749 can include an electrical terminal, connector, or contact that is positioned to engage with the electrical contact 753 of the battery 702 to establish an electrical connection. In some examples, a cable, a wire, or a flex cable 757 can transfer power from the battery 702 to the components of the HMD. In other examples, a conductive surface can be formed on the enclosure 749 to establish an electrical via between the battery 702 and an electrical component within the HMD.

The guide rail 744 can be coupled to the enclosure 749 using any suitable attachment. For example, the guide rail 744 can be adhered, bolted, screwed, friction fitted, fastened, or magnetically coupled to the enclosure 749. In some examples, the contacts 753 and 755 are electromagnets that aid in coupling the guide rail 744 to the enclosure 749 and establish an electrical connection between the battery and a main-logic board or other electrical component of the HMD. The guide rail 744 can, in some examples, be pivotally mounted to the enclosure 749.

Any of the features, components, and/or parts, including the arrangements and configurations thereof shown in FIG. 7 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 7.

Figure 8:
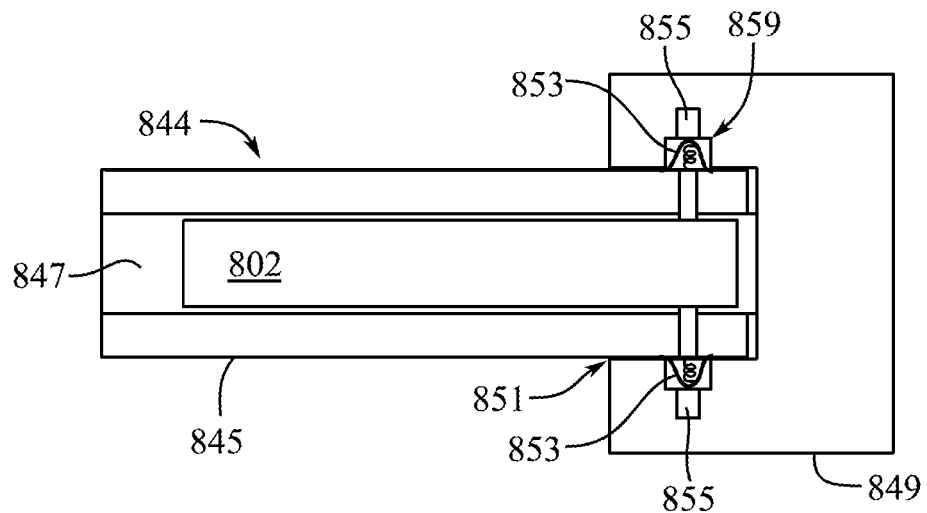
FIG. 8 shows a cross-sectional view of a battery integrated guide rail.

FIG. 8 shows a cross-sectional view of a battery integrated guide rail 844 according to one exemplary embodiment. As shown in FIG. 8, the guide rail 844 can be substantially similar to, including some or all of the features of, the guide rails described herein. In some examples, the guide rail 844 can include one or more biased contact pins 853. The biased contact pins 853 can include, for example, spring-loaded pogo pins. The biased contact pins 853 can be biased into cavities or grooves 859 in the enclosure 849. The cavities 859 can be formed within the recess 851. In some examples, electrical terminals 855 can be positioned or exposed within the cavities 859 to establish an electrical connection with the biasing contact pins 853. Thus, the battery 802 can be in electrical communication with the HMD via biasing contact pins 853 and terminals 855.

In some examples, the biasing contact pins 853 can include a spring to extend the contact pins 853 into the cavities 859. The biasing contact pins 853 can aid in securing the guide rail 844 within the recess 851. The biasing contact pins 853 can be depressed under a force from the user, such as a pulling motion on the guide rail 844, in order to remove the guide rail 844 from the enclosure 849. In some examples, the guide rail 844 can be removably inserted into the enclosure 849 by pushing or pressing the guide rail 844 into the recess 851. Upon contacting the enclosure 849, the biasing contact pins 853 can depress or compress in order to allow passage of the guide rail housing 845 into the recess 851. Once the guide rail 844 passes a certain distance into the cavity 851, the biasing contact pins 853 can decompress or extend into the cavities 859, thereby removably retaining the guide rail 844 to the enclosure 849 and establishing an electrical communication between the battery 802 and the HMD.

Any of the features, components, and/or parts, including the arrangements and configurations thereof shown in FIG. 8 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 8.

Figure 9:
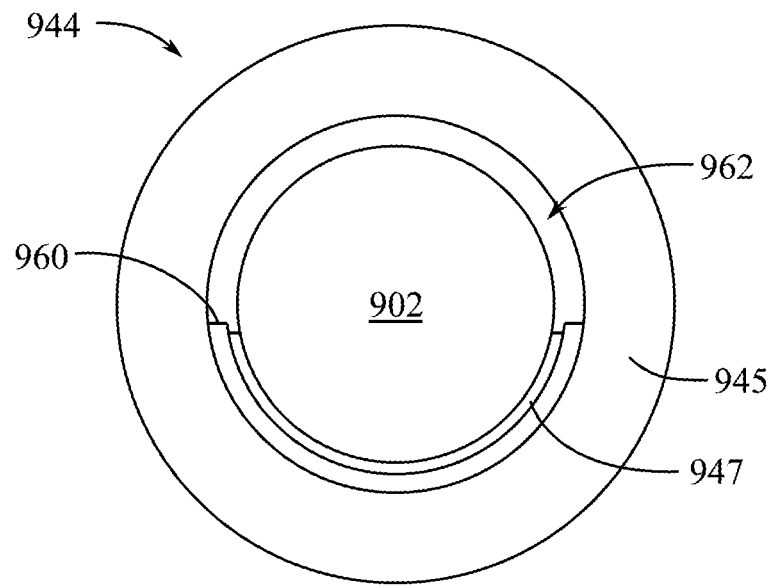
FIG. 9 shows a cross-sectional view of a battery integrated guide rail.

FIG. 9 shows a cross-sectional view of a battery integrated guide rail 944. The guide rail 944 can be substantially similar to, including some or all of the features of, the guide rails described herein. The guide rail 944 can include a support or sled 960 on which the battery 902 can be positioned. The sled 960 can be positioned within the internal volume 962 of the housing 945. The sled 960 can be positioned between the battery 902 and the housing 945. In some examples, a cross-section of the guide rail 944 can be circular or curved. In some examples, the sled 960 can include a shape that conforms to or matches a shape of the interior surface of the housing 945. For example, in the embodiment of FIG. 9, the sled 960 can be curved to match a curvature of the housing 945. The battery 902 can be secured to the sled 960. In some examples, the battery 902 can be adhered to the sled 960 via an adhesive 947. In some examples, the sled 960 can include wheels or rollers. As discussed in greater detail with regard to FIGS. 11 and 12, in some examples the sled 960 can be movable relative to the housing 945 to insert and remove the battery 902 from the housing 945.

Any of the features, components, and/or parts, including the arrangements and configurations thereof shown in FIG. 9 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 9.

Figure 10:
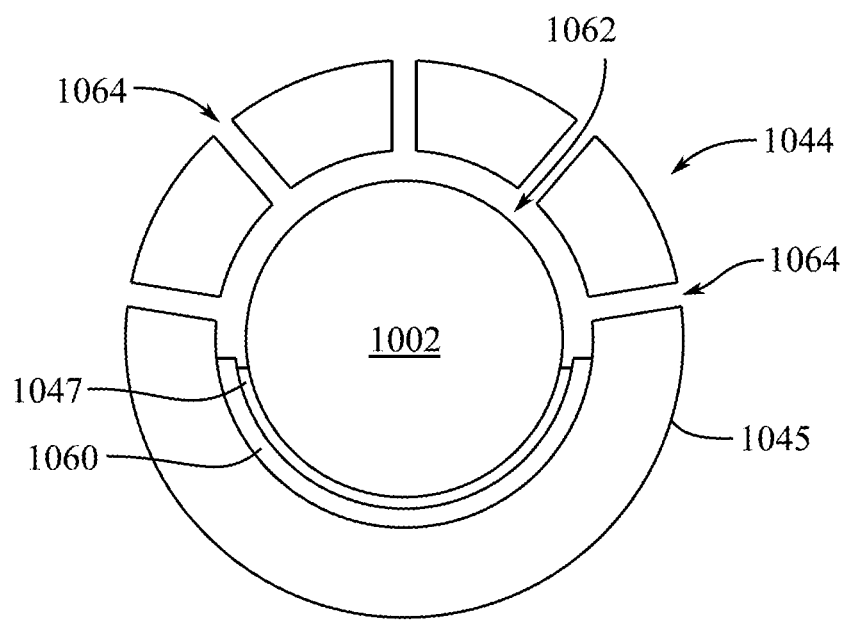
FIG. 10 shows a cross-sectional view of a battery integrated guide rail.

FIG. 10 shows a cross-sectional view of a battery integrated guide rail. The guide rail 944 can be substantially similar to, including some or all of the features of, the guide rails described herein. In some examples, the housing 1045 of the guide rail 1044 can include one or more apertures or openings 1064 to vent or cool the battery 1002. In other words, the openings 1064 in the housing 1045 can define an airflow path, placing the internal volume 1062 of the housing 1045 in fluid communication with the outside environment. Thus, the battery 1002 can be cooled by forming holes 1064 in the housing 1045. Further venting examples and embodiments are discussed below with reference to FIG. 13.

FIG. 10 shows only a top portion of the housing as including openings. However, it will be understood the openings can be located around/along an entirety of the housing 1045, including a lower portion of the housing 1045. Although not illustrated in FIG. 10, in some examples, the sled 1060 can include openings to allow heat generated by the battery 1002 to vent into the outside environment. Further details regarding guide rails, and specifically regarding the sled configurations are described below with reference to FIGS. 11 and 12.

Any of the features, components, and/or parts, including the arrangements and configurations thereof shown in FIG. 10 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 10.

Figure 11:
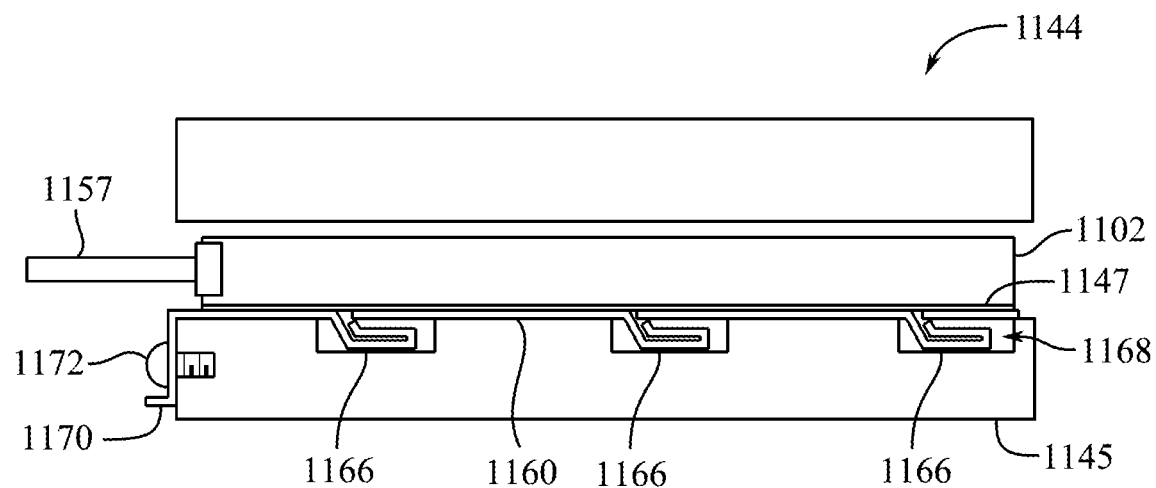
FIG. 11 shows a cross-sectional view of a battery integrated guide rail.

FIG. 11 shows a cross-sectional view of a battery integrated guide rail 1144. The guide rail 1144 can be substantially similar to, including some or all of the features of, the guide rails described herein.

It can be advantageous to produce a battery integrated guide rail that includes an easily removable battery 1102. However, the desire to remove the battery 1102 must be balanced with the need to securely attach the battery 1102 within the guide rail 1144. As shown in FIG. 11, the battery 1102 can be fixedly attached to a removable support or sled 1160 which is detachably coupled to the housing 1145 of the guide rail 1144. In some examples, the sled 1160 can be a distinct component of the guide rail 1144 that is adhered to the battery 1102. In some examples, the sled 1160 can be an exterior portion or surface of the battery 1102 (i.e., not a separate component from the battery 1102).

In some examples, the sled 1160 can be removed or detached from the housing 1145. The sled 1160 can be attached to the housing 1145 using any suitable attachment mechanism. For example, the sled 1160 can include one or more attachment components that couple to corresponding attachment components of the housing. In the specific example illustrated in FIG. 11, the sled 1160 includes feet, protrusions, or clips 1166 that engage or clip into recesses or retention apertures 1168 defined by, or formed in, the housing 1145. In some examples, the feet 1166 and/or the recesses 1168 can be shaped and designed to allow for removable coupling with each other. For example, the feet 1166 can include a flexible design that allows the feet to bend or flex in order to be removed from the recesses 1168. In some examples, the feet 1166 can include an angled surface, such as a slope or a ramp that allows the feet 1166 to be withdrawn from the recess 1168 to remove the sled 1160 and battery 1102 from the housing 1145.

In some examples, the sled 1160 can include a bracket portion, such as a flange 1170, that engages or contacts a portion of the housing 1145, such as an edge or end of the housing 1145. The flange 1170 can be secured to the end of the housing 1145 via a fastener 1172, thereby securing the sled 1160 in place relative to the housing 1145. It will be understood that other attachment means for removably coupling the sled 1160 to the housing 1145 can be used to securely couple the sled 1160 to the housing 1145, including but not limited to magnets, adhesive, fasteners, or any other suitable coupler.

In some examples, the battery 1102 can include a wire or a cable, such as flexible circuitry that establishes an electrical connection between the battery 1102 and the HMD. The cable 1157 can extend from an end of the battery 1102 and through an open end of the housing 1145 and can provide power to the HMD. The cable 1157 can be sufficiently long and can include enough slack to accommodate for motion of the guide rail 1144 relative to the HMD.

Any of the features, components, and/or parts, including the arrangements and configurations thereof shown in FIG. 11 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 11.

Figure 12:
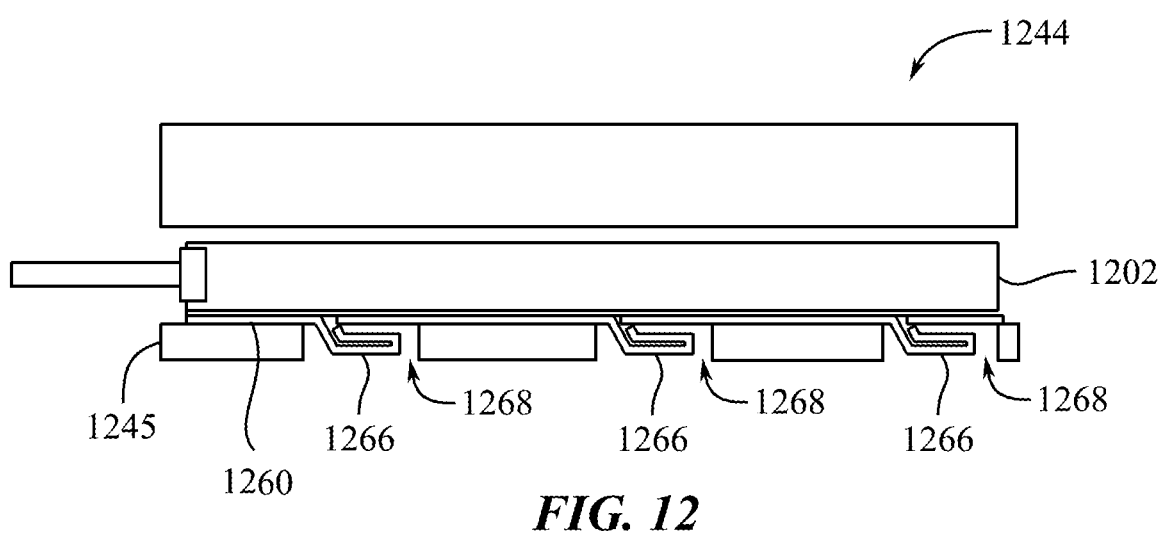
FIG. 12 shows a cross-sectional view of a battery integrated guide rail.

FIG. 12 shows a cross-sectional view of a battery integrated guide rail 1244. The guide rail 1244 can be substantially similar to, including some or all of the features of, the guide rails described herein. In some examples, the housing 1245 can define one or more through-holes or openings 1266 which extend entirely through the wall of the housing 1245, as opposed to the recesses 1168 of FIG. 11 which do not extend entirely through the housing 1245. The openings 1268 can be positioned to receive the feet 1266 of the sled 1260. The openings 1268 can allow the feet 1266 to be accessible from an exterior of the guide rail 1244. In some examples, a user can press or manipulate the feet 1266 through the openings 1268 in order to depress and detach the sled 1260 from the housing 1245 and remove the battery 1202.

In some examples, the sled 1260 can form a hard stop or barrier that the optical module contacts and prevents further motion of the optical module beyond the hard stop. In some examples, the sled 1260 can include a cable guide or strain relief for an interconnect cable. In other examples, the sled 1260 can include crumple zones or locations of designed failure when predefined forces are reached, to protect ends of the guide rail 1244. In other words, the sled 1260 can include protective sections that cushion or structurally support the guide rail 1244.

Any of the features, components, and/or parts, including the arrangements and configurations thereof shown in FIG. 12 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 12.

Figure 13:
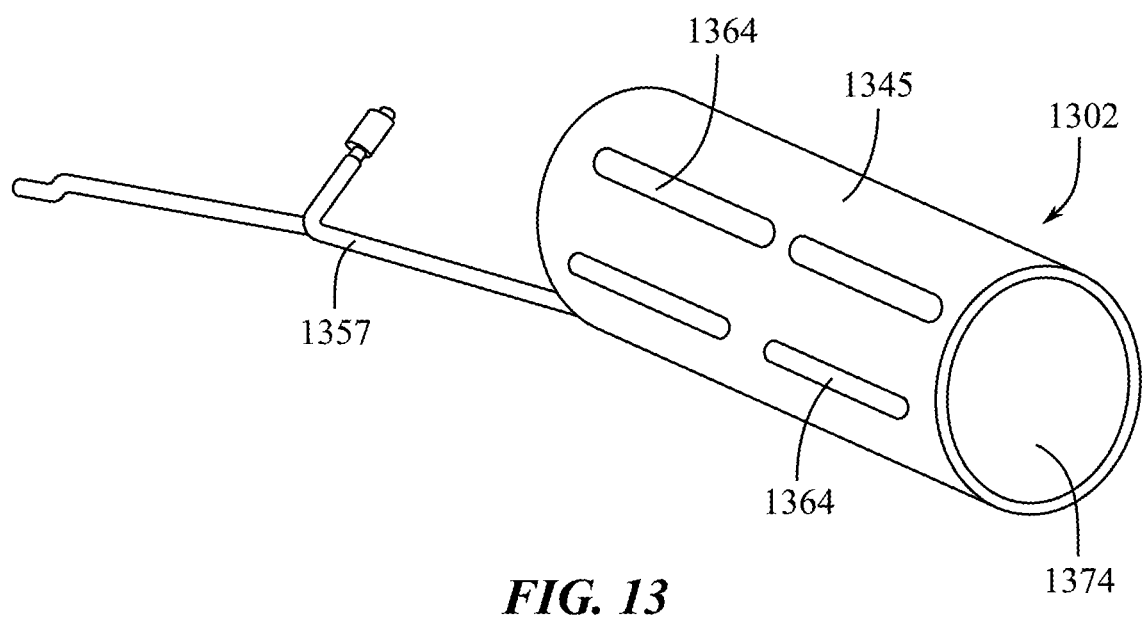
FIG. 13 shows a cross-sectional perspective view of battery.

FIG. 13 shows a cross-sectional perspective view of battery 1302. The battery 1302 can be substantially similar to, including some or all of the features of, the batteries and/or guide rails described herein. In some examples, the battery 1302 can include a housing or shell 1345 that forms an exterior protective surface and container of the battery cells 1374. The battery cells 1374 can include a roll of anode and cathode components. The anode and cathode components 1374 can be electrically connected to the HMD via cable 1357.

As illustrated in FIG. 13. In some examples, the shell 1345 can include elongated vents 1364 that run along and around the shell 1345 in order to improve thermals of the battery 1302. The vents 1364 can include mesh or protective screens to prevent debris ingress.

In some examples, the battery 1302 can include cylindrical cells that include a roll of anode and cathode material 1374 that is positioned in the outer casing 1345. The outer casing 1345 can include steel or aluminum. In some examples, the outer casing 1345 is the guide rail. The anode and cathode components 1374 can contact directly the outer casing 1345. In other words, the anode and cathode components 1374 can directly contact the housing of a guide rail.

In other examples, the outer casing in surrounded by or encapsulated by the guide rail housing.

In some examples, the outer casing 1345 can structurally support the cylindrical cells 1374 to maintain their shape. However, the examples where the outer casing 1345 is surrounded by the housing of the guide rail, it may not be necessary for the outer casing 1345 to be structurally rigid. Instead, the outer casing 1345 can be thin and flexible, relying instead on the guide rail housing for structural support of the battery 1302. It will be understood that the traditional housing of the battery (i.e., outer casing 1345) can be replaced by the housing of the guide rail when integrating the battery into a guide rail.

In some examples, an optical module of an HMD can be movably attached to the battery 1302, such that the battery 1302 guides motion of the optical module. In this manner, the battery 1302 can be a guide rail, such as those described herein.

Any of the features, components, and/or parts, including the arrangements and configurations thereof shown in FIG. 13 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A head-mountable device, comprising:
an optical module configured to present visual information to a user;
the optical module movably attached to a structure, the structure defining a motion path of the optical module, the structure comprising:
a housing defining an internal volume; and
a battery disposed within the internal volume.

2. The head-mountable device of claim 1, wherein:
the structure is a first guide rail;
the battery is a first battery;
the optical module is a first optical module; and
the head-mountable device further comprises a second optical module movably attached to a second guide rail, the second guide rail housing a second battery.

3. The head-mountable device of claim 1, wherein the structure comprises:
an upper structure, the optical module being movably attached to the upper structure; and
a lower structure, the lower structure housing a second battery.

4. The head-mountable device of claim 1, wherein the structure comprises a guide rail that defines a motion pathway of the optical module.

5. The head-mountable device of claim 1, wherein the structure is cylindrical.

6. The head-mountable device of claim 1, wherein the structure further comprises an electrical connection establishing electrical communication between the battery and the head-mountable device.

7. The head-mountable device of claim 1, wherein the housing defines an air gap between an internal surface of the housing and the battery.

8. The head-mountable device of claim 1, wherein the structure is attached to a mounting enclosure of the head-mountable device, an electrical pathway positioned through the mounting enclosure.

9. The head-mountable device of claim 1, further comprising a cable extending from the battery through an open end of the structure.

10. The head-mountable device of claim 1, wherein:
the battery comprises an anode material and a cathode material; and
each of the anode material and the cathode material directly contacts the housing of the structure.

11. A guide rail for a head-mounted display, the guide rail comprising:
a housing defining an exterior surface and an internal volume; and
a power source positioned in the internal volume;

wherein the exterior surface of the guide rail is configured to interface with a movable lens structure.

12. The guide rail of claim 11, wherein the power source is removable from the housing.

13. The guide rail of claim 11, wherein the power source is fixed in the housing via an adhesive.

14. The guide rail of claim 11, further comprising a sled fixed to the battery and removably attached to the housing.

15. The guide rail of claim 14, wherein the sled comprises a protrusion configured to releasably couple with a recess of the housing.

16. The guide rail of claim 11, wherein the housing comprises a carbon fiber filled composite.

17. The guide rail of claim 11, wherein the housing defines a vent forming an airflow path between the internal volume and an ambient environment.

18. A head-mountable device, comprising:
a battery including a battery housing; and
an optical module including an actuator rotatably engaging the battery housing to translate the optical module.

19. The head-mountable device of claim 18, wherein the battery comprises a cylindrical cell.

20. The head-mountable device of claim 18, wherein the battery housing comprises a flame resistant material.

\* \* \* \* \*